US007597568B1

(12) United States Patent
Lu

(10) Patent No.: US 7,597,568 B1
(45) Date of Patent: Oct. 6, 2009

(54) ELECTRONIC DEVICE AND DUST-PROOF MECHANISM THEREOF

(75) Inventor: Fu-Lung Lu, Taipei (TW)

(73) Assignee: Wistron Corp., Taipei Hsien (TW)

( * ) Notice: Subject to any disclaimer, the term of this patent is extended or adjusted under 35 U.S.C. 154(b) by 0 days.

(21) Appl. No.: 12/129,616

(22) Filed: May 29, 2008

(51) Int. Cl.
*H01R 13/44* (2006.01)

(52) U.S. Cl. .................................................... 439/137

(58) Field of Classification Search ................ 439/137, 439/135, 142, 536; 206/387.12
See application file for complete search history.

(56) References Cited

U.S. PATENT DOCUMENTS

| | | | | |
|---|---|---|---|---|
| 4,713,017 | A | * | 12/1987 | Pesapane ..................... 439/142 |
| 4,875,584 | A | * | 10/1989 | Ackeret ................. 206/387.12 |
| 5,306,178 | A | * | 4/1994 | Huang ........................ 439/536 |
| 7,086,880 | B2 | * | 8/2006 | Uchida ........................ 439/141 |
| 7,223,108 | B2 | * | 5/2007 | Chiang et al. ................ 439/137 |
| 2005/0287853 | A1 | * | 12/2005 | Kim et al. .................... 439/137 |

* cited by examiner

*Primary Examiner*—Alexander Gilman
(74) *Attorney, Agent, or Firm*—Quintero Law Office

(57) ABSTRACT

An electronic device and a dust-proof mechanism thereof are disclosed. The electronic device is electrically connected to a charger and includes a power source, a housing with a hole and a sliding track and a dust-proof mechanism. The dust-proof mechanism includes a pivot cover and a slide cover. The pivot cover includes a pivoting side and a rotating side. The pivoting side is rotatably installed adjacent to the hole of the housing. The slide cover is disposed on the sliding track and movably installed adjacent to the rotating side. When the charger does not enter the hole, the pivot cover is disposed in a closed position to cover the hole and the slide cover is adjacent to the rotating side of the pivot cover. When the charger is inserted into the hole and pushes the pivot cover, the pivot cover is disposed in an opened position and the slide cover is pushed until the charger is electrically connected to the power source.

12 Claims, 5 Drawing Sheets

ELECTRONIC DEVICE AND DUST-PROOF MECHANISM THEREOF

BACKGROUND OF THE INVENTION

1. Field of the Invention

The invention relates to an electronic device and a dust-proof mechanism thereof, and more particularly to an electronic device and a dust-proof mechanism thereof electrically connected to a charger.

2. Description of the Related Art

A conventional electronic device includes a housing and a power source. The housing includes a hole. When the electronic device needs to be charged, a charger is inserted into the hole and is electrically connected to the power source. However, for most conventional electronic devices, there is no cover to cover the hole for dust prevention. Some conventional electronic devices provide a cover to cover the hole when the electronic device does not need to be charged. However, to charge the electronic device, a user must open the cover by hands for the charger to enter the hole for charging. Thus, conventional electronic devices have dust prevention deficiencies and manipulation inconveniences.

BRIEF SUMMARY OF THE INVENTION

The invention provides an electronic device and a dust-proof mechanism thereof. The dust-proof mechanism is disposed in the electronic device. The electronic device is electrically connected to a charger and includes a power source, a housing with a hole and a sliding track and the dust-proof mechanism. The dust-proof mechanism comprises a pivot cover and a slide cover. The pivot cover includes a pivoting side and a rotating side. The pivoting side is rotatably installed adjacent to the hole of the housing. The slide cover is disposed on the sliding track and movably installed adjacent to the rotating side. When the charger does not enter the hole, the pivot cover is disposed in a closed position to cover the hole and the slide cover is adjacent to the rotating side of the pivot cover. When the charger is inserted into the hole and pushes the pivot cover, the pivot cover is disposed in an opened position and the slide cover is pushed until the charger is electrically connected to the power source.

Note that the electronic device further includes an axle, the housing further includes a connecting portion, and the axle is connected to the pivoting side and the connecting portion.

Note that the electronic device further includes a compression spring wherein. the compression spring is connected between the axle and the pivot cover.

Note that the electronic device further includes a first waterproof member wherein. the first waterproof member is disposed between the slide cover and the pivot cover.

Note that the electronic device further includes a second waterproof member wherein the second waterproof member is disposed between the slide cover, the pivot cover and the hole.

Note that the electronic device further includes a tension spring, wherein the tension spring is disposed between the housing and the slide cover.

Note that the housing further comprises a protrusion and the slide cover comprises a fixing portion, wherein the tension spring is connected to the protrusion and the fixing portion.

BRIEF DESCRIPTION OF DRAWINGS

The invention can be more fully understood by reading the subsequent detailed description and examples with references made to the accompanying drawings, wherein.

The invention can be more fully understood by reading the subsequent detailed description and examples with references made to the accompanying drawings.

DETAILED DESCRIPTION OF THE INVENTION

Figure 1:
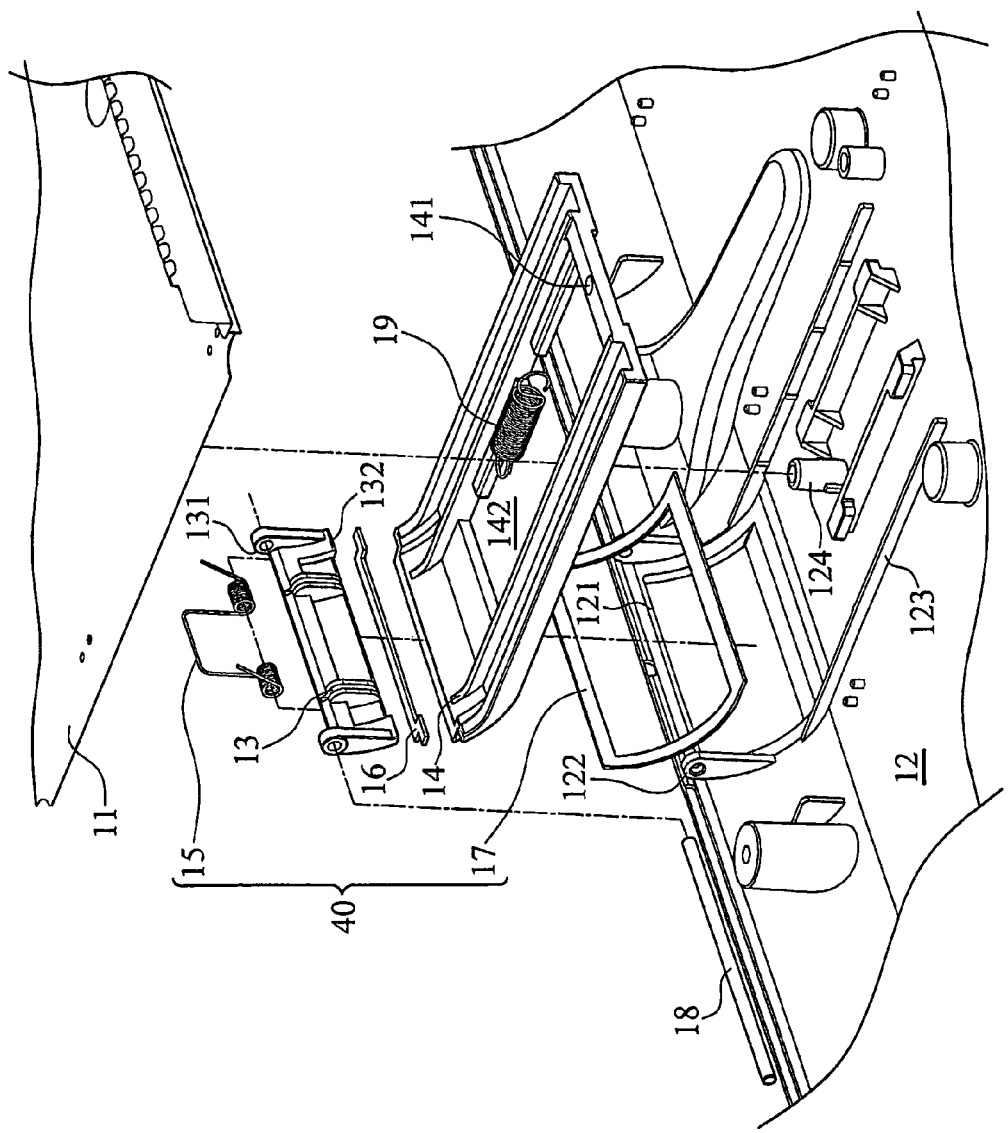
FIG. 1 is an exploded view of an electronic device.
Figure 5:
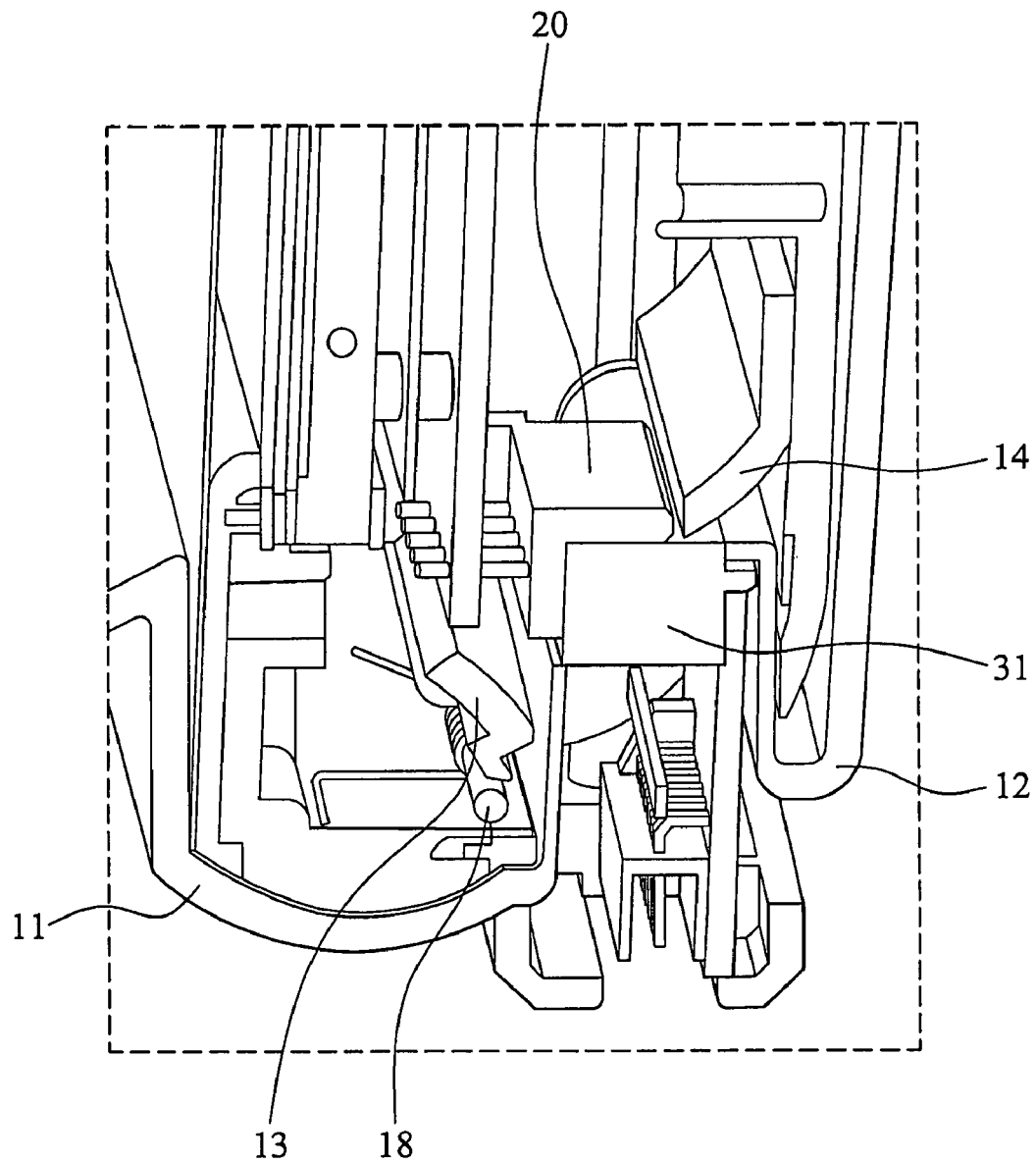
FIG. 5 is a partial enlarged view of FIG. 4.

FIG. 1 is an exploded view of an electronic device. Referring to FIG. 1 and FIG. 5, an electronic device 10 comprises an upper housing 11, a power source 20 (shown in FIG. 5), a housing 12 and a dust-proof mechanism 40. The upper housing 11 is connected to the housing 12. The dust-proof mechanism 40 and the power source 20 are disposed between the upper housing 11 and the housing 12. The housing 12 comprises a hole 121, a connecting portion 122, a sliding track 123 and a protrusion 124. The dust-proof mechanism 40 comprises a pivot cover 13, a slide cover 14, a compression spring 15, a first waterproof member 16, a second waterproof member 17, an axle 18 and tension spring 19. The pivot cover 13 comprises a pivoting side 131 and a rotating side 132. The pivoting side 131 is rotatably installed on the connecting portion 122 adjacent to the hole 121 of the housing 12. The slide cover 14 is disposed on the sliding track 123 and movably installed adjacent to the rotating side 132. The axle 18 is connected to the pivoting side 131 and the connecting portion 122. The axle 18 passes through the pivoting side 131 and is fixed to the connecting portion 122. The compression spring 15 is connected between the axle 18 and the pivot cover 13. The first waterproof member 16 is disposed between the slide cover 14 and the pivot cover 13. The second waterproof member 17 is disposed between the slide cover 14, the pivot cover 13 and the hole 121. The tension spring 19 is disposed between the housing 12 and the slide cover 14. The slide cover 14 comprises a fixing portion 141 and an opening 142. The protrusion 124 protrudes to the opening 142. The tension spring 19 is connected to the protrusion 124 and the fixing portion 141.

Figure 2:
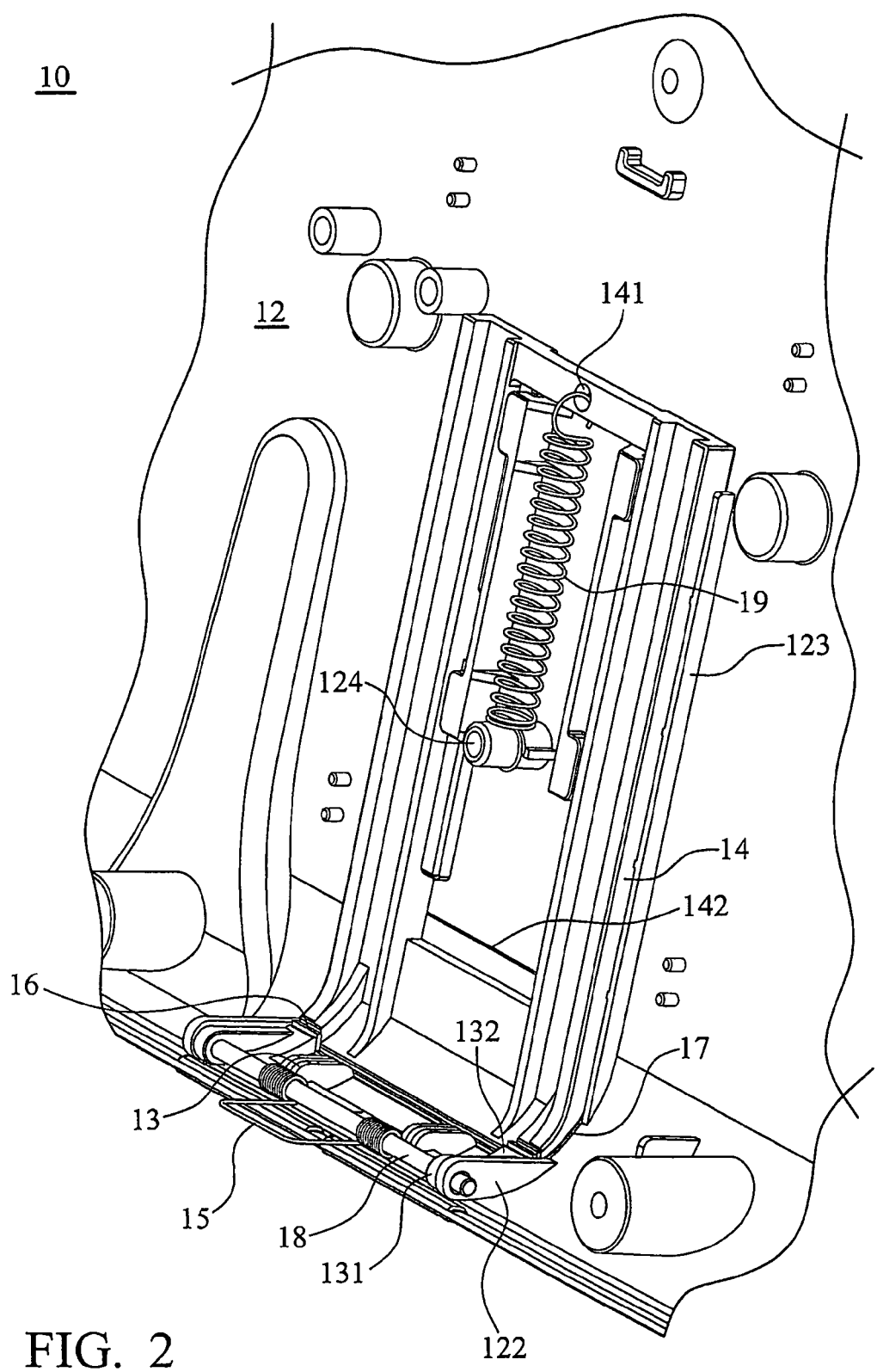
FIG. 2 is a schematic view showing a pivot cover in a closed position.
Figure 3:
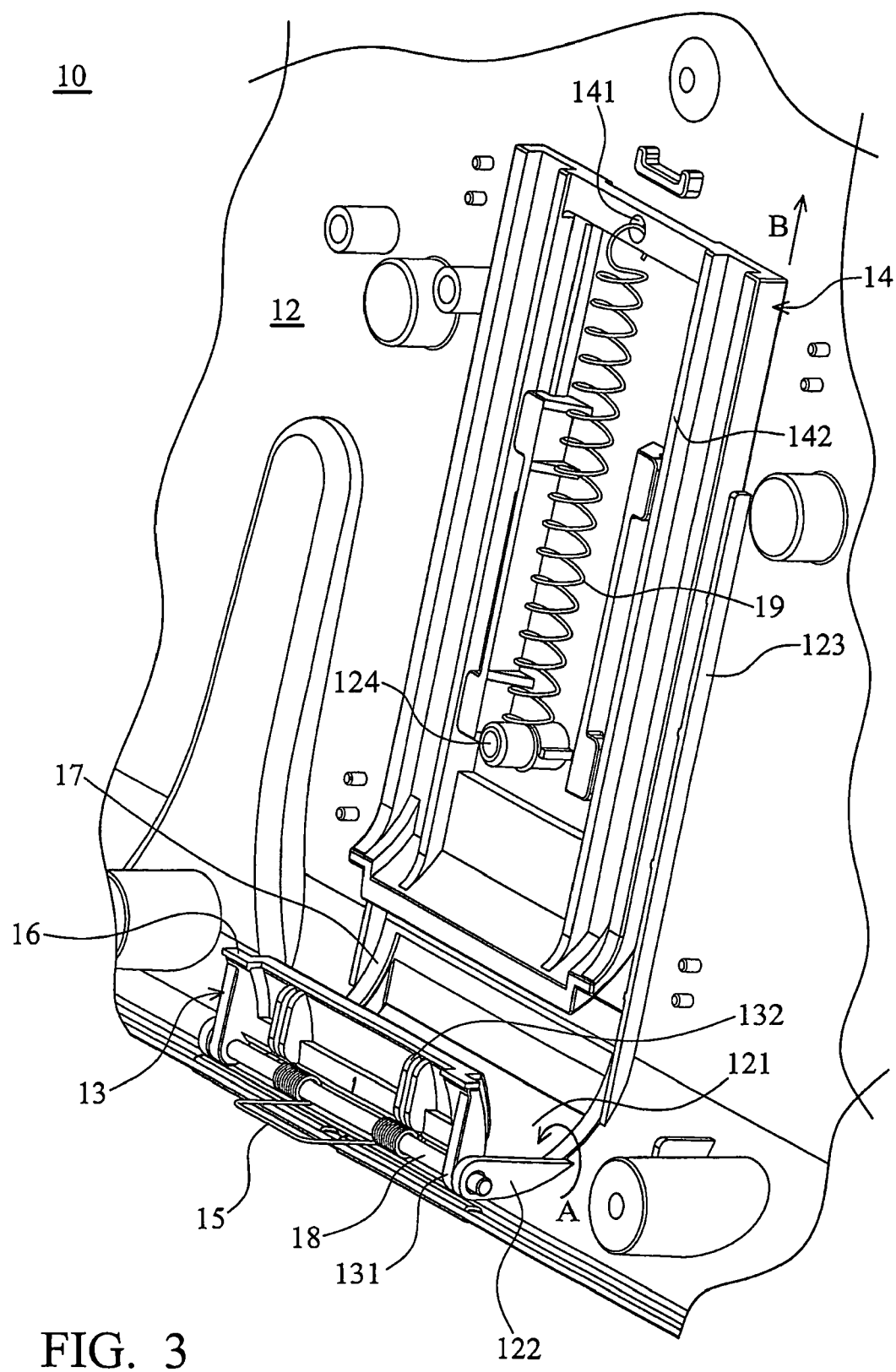
FIG. 3 is a schematic view showing a pivot cover in an opened position.

FIG. 2 is a schematic view showing a pivot cover in a closed position. FIG. 3 is a schematic view showing a pivot cover in an opened position. Referring to FIGS. 2 and 3, when the charger 30 (shown in FIG. 4) does not enter the hole 121, the pivot cover 13 is disposed in a closed position to cover the hole 121 and the slide cover 14 is adjacent to the rotating side 132 of the pivot cover 13. When the pivot cover 13 is disposed in a closed position, the first waterproof member 16 and a second waterproof member 17 seal gaps between the hole 121, the slide cover 14 and the pivot cover 13 for dust prevention.

Figure 4:
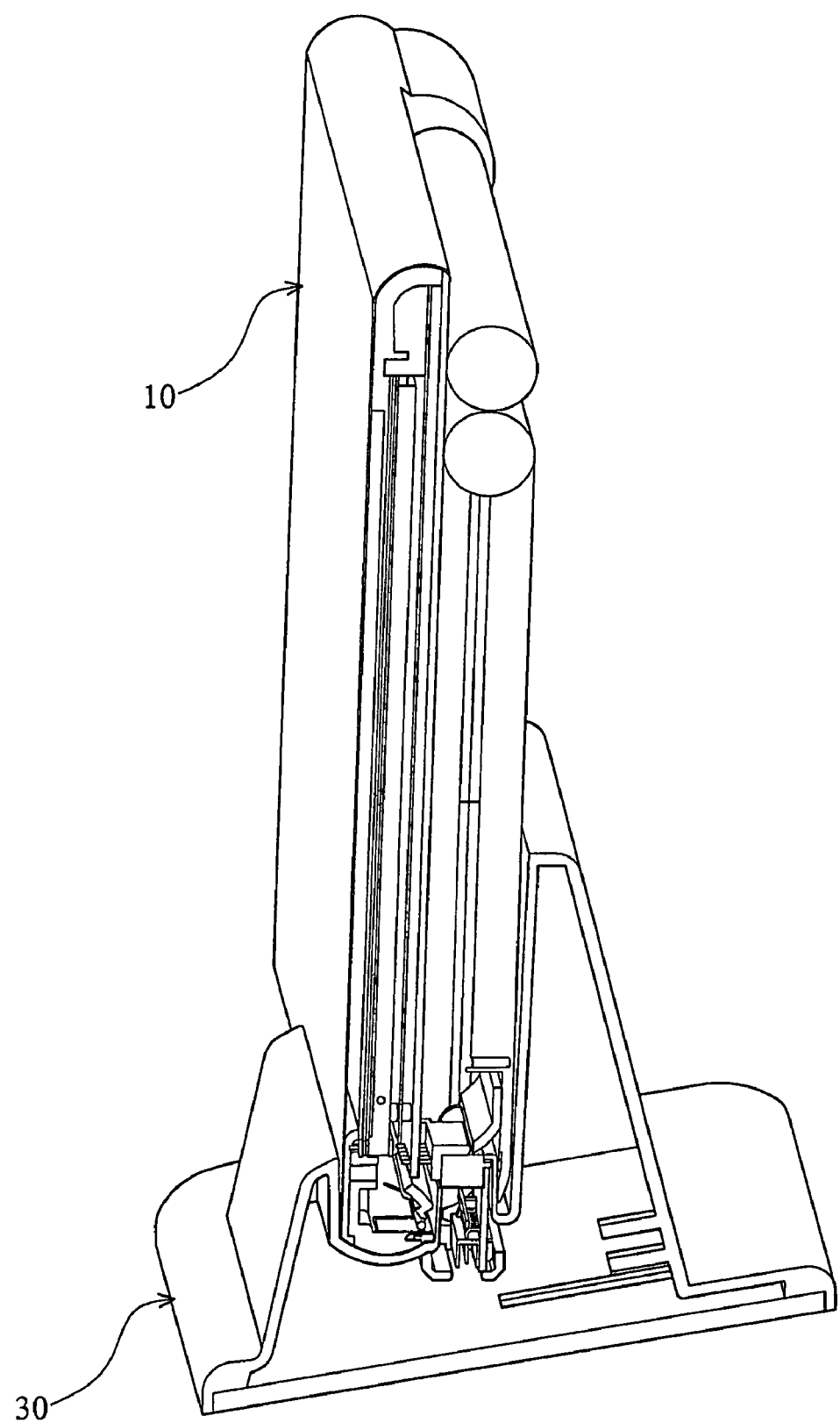
FIG. 4 is a schematic view showing an electronic device which is electrically connected to a charger.

FIG. 4 is a schematic view showing an electronic device which is electrically connected to a charger. FIG. 5 is a partial enlarged view of FIG. 4. Referring to FIGS. 1 to 5, the charger 30 comprises a connector 31. When the charger 30 (shown in FIG. 4) is inserted into the hole 121 and pushes the pivot cover 13, the pivot cover 13 rotates along an arrow A until the pivot cover 13 is disposed in an opened position. Then, the slide cover 12 is pushed along an arrow B (shown in FIG. 3) until the connector 31 of the charger 30 is electrically connected to the power source 20 (shown in FIG. 5). Note that after the charger 30 leaves the hole 121, the compression spring 15 pulls back the pivot cover 13 to cover the hole 121 and the tension spring 19 pulls back the slide cover 14 to prop the rotating side 132. Thus, when the charger 30 is inserted into the hole, a user does not need manipulate the dust-proof mechanism 40 by hand. The dust-proof mechanism 40 is automatically moved and provides convenient manipulation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dust-proof mechanism, disposed in an electronic device, wherein the electronic device has a power source and a housing with a hole, and a charger is electrically connected to the electronic device, comprising:
    a pivot cover, comprising a pivoting side and a rotating side, wherein the pivoting side is rotatably installed adjacent to the hole of the housing;
    a slide cover, movably installed adjacent to the rotating side; and
    a tension spring disposed between the housing and the slide cover;
    wherein when the charger does not enter the hole, the pivot cover is disposed in a closed position to cover the hole and the slide cover is adjacent to the rotating side of the pivot cover; and
    when the charger is inserted into the hole and pushes the pivot cover, the pivot cover is disposed in an opened position and the slide cover is pushed until the charger is electrically connected to the power source.

2. The dust-proof mechanism as claimed in claim 1, further comprising an axle, wherein the housing further comprises a connecting portion, the axle is connected to the pivoting side and the connecting portion.

3. The dust-proof mechanism as claimed in claim 2, further comprising a torsion spring, wherein the compression spring is connected between the axle and the pivot cover.

4. The dust-proof mechanism as claimed in claim 1, further comprising a first waterproof member, wherein the first waterproof member is disposed between the slide cover and the pivot cover.

5. The dust-proof mechanism as claimed in claim 1, further comprising a second waterproof member, wherein the second waterproof member is disposed between the slide cover, the pivot cover and the hole.

6. The dust-proof mechanism as claimed in claim 1, wherein the housing further comprises a protrusion and the slide cover comprises a fixing portion, and the tension spring is connected to the protrusion and the fixing portion.

7. An electronic device, electrically connected to a charger, comprising:
    a power source;
    a housing comprising a hole and a sliding track; and
    a dust-proof mechanism comprising:
        a pivot cover, comprising a pivoting side and a rotating side, wherein the pivoting side is rotatably installed adjacent to the hole of the housing;
        a slide cover, disposed on the sliding track and movably installed adjacent to the rotating side; and
        a tension spring disposed between the housing and the slide cover;
        wherein when the charger is not connected to the hole, the pivot cover is disposed in a closed position to cover the hole and the slide cover is adjacent to the rotating side of the pivot cover; and
        when the charger is inserted into the hole and pushes the pivot cover, the pivot cover is disposed in an opened position and the slide cover is pushed until the charger is electrically connected to the power source.

8. The electronic device as claimed in claim 7, further comprising an axle, wherein the housing further comprises a connecting portion, and the axle is connected to the pivoting side and the connecting portion.

9. The electronic device as claimed in claim 8, further comprising a torsion spring, wherein the compression spring is connected between the axle and the pivot cover.

10. The electronic device as claimed in claim 7, further comprising a first waterproof member, wherein the first waterproof member is disposed between the slide cover and the pivot cover.

11. The electronic device as claimed in claim 7, further comprising a second waterproof member, wherein the second waterproof member is disposed between the slide cover, the pivot cover and the hole.

12. The electronic device as claimed in claim 7, wherein the housing further comprises a protrusion and the slide cover comprises a fixing portion, and the tension spring is connected to the protrusion and the fixing portion.

* * * * *